(12) United States Patent
Schröder genannt Berghegger

(10) Patent No.: US 12,362,751 B2
(45) Date of Patent: Jul. 15, 2025

(54) PULSE VOLTAGE DOUBLER AND LEVEL SHIFTER

(71) Applicant: Honeywell International Inc., Charlotte, NC (US)

(72) Inventor: Ralf Heinrich Schröder genannt Berghegger, Glandorf (DE)

(73) Assignee: Honeywell International Inc., Charlotte, NC (US)

( * ) Notice: Subject to any disclaimer, the term of this patent is extended or adjusted under 35 U.S.C. 154(b) by 173 days.

(21) Appl. No.: 18/229,461

(22) Filed: Aug. 2, 2023

(65) Prior Publication Data

US 2025/0047283 A1 Feb. 6, 2025

(51) Int. Cl.
| | | |
|---|---|---|
| H03K 19/018 | (2006.01) | |
| H03K 17/30 | (2006.01) | |
| H03K 17/60 | (2006.01) | |
| H03K 19/084 | (2006.01) | |

(52) U.S. Cl.
CPC ....... *H03K 19/01806* (2013.01); *H03K 17/30* (2013.01); *H03K 17/60* (2013.01); *H03K 19/084* (2013.01)

(58) Field of Classification Search
CPC ......... H03K 19/01806; H03K 19/0133; H03K 19/084; H03K 17/30; H03K 17/60
See application file for complete search history.

(56) References Cited

U.S. PATENT DOCUMENTS

| | | | |
|---|---|---|---|
| 6,850,111 B1 * | 2/2005 | Ausserlechner | H03K 17/667 363/59 |
| 7,161,331 B2 | 1/2007 | Wai et al. | |
| 7,450,987 B2 | 11/2008 | Varrichio et al. | |
| 7,977,927 B2 | 7/2011 | Williams | |
| 9,780,674 B2 | 10/2017 | Freeman et al. | |
| 9,983,244 B2 * | 5/2018 | Juntunen | H02J 50/001 |
| 2011/0248703 A1 * | 10/2011 | Rabjohn | G01R 21/12 324/123 R |

FOREIGN PATENT DOCUMENTS

KR 20110010930 A * 2/2011 .............. H02M 1/38

OTHER PUBLICATIONS

"Honeywell American Meter, AC-250NX Diaphragm Meter," Honeywell International Inc., 2019.
"AC-250NX Diaphragm Meter, Part List", Honeywell International Inc., 2020.

* cited by examiner

Primary Examiner — Seokjin Kim
(74) Attorney, Agent, or Firm — Ortiz & Lopez, PLLC; Kermit D. Lopez; Luis M. Ortiz

(57) ABSTRACT

An electrical circuit and a method of operating the electrical circuit can include a group of transistors including one or more of a first transistor and a second transistor, wherein the first transistor is electronically connected to an input and an output of the electrical circuit, and the second transistor is electronically connected to the first transistor and the output. The electrical circuit can also include a group of resistors including a first base resistor and a second base resistor, wherein the first base resistor is electronically connected to a voltage supply, the first transistor, the second base resistor and one or more diodes. The electrical circuit may also include one or more capacitors electronically connected to the input, the first transistor, the second transistor, and the diode(s) and the output, such that an output voltage at the output is approximately double the supply voltage of the electrical circuit.

20 Claims, 6 Drawing Sheets

PULSE VOLTAGE DOUBLER AND LEVEL SHIFTER

TECHNICAL FIELD

Embodiments are generally related to devices and systems that operate with an output voltage higher than the supply voltage. Embodiments also relate to electrical and electronic circuits such as level shifters pulse voltage doublers.

BACKGROUND

In many electronic and electrical systems, the output voltage of the system is limited by the supply voltage. However, there are situations where it may be necessary to have an output voltage higher than the supply voltage. For example, power amplification may be required in cases where it may be necessary to increase the power of a signal. This situation may require boosting the voltage level, which may be higher than the supply voltage. Power amplifiers may use various techniques, such as voltage multipliers or transformer-based solutions, to generate higher output voltages.

There are also various specialized applications, such as high-voltage testing, electrostatic precipitators, or scientific experiments, that may require significantly higher voltages than the available supply voltage. In such cases, specialized high-voltage generation techniques, like voltage multipliers or Cockcroft-Walton generators, are used to achieve the desired output voltage.

Other situations in which an output voltage higher than the supply voltage of a system is needed include increasing the volume of an acoustic or ultrasonic signal of a piezoelectric transducer and controlling the gate of a transistor such as a MOSFET. In conventional approaches, this can be solved by introducing a level shifter, which requires a second supply voltage that is higher than the voltage of the rest of the system. The higher voltage may be generated by a boost converter, which is a type of voltage regulator circuit that can be used to provide an output voltage higher than the supply voltage in an electronic system. Note that the level shifter should be fast, and its supply current should be low, particularly when is used in a battery powered system. This combination is difficult to achieve with conventional approaches.

Generating an output voltage higher than the supply voltage usually involves additional circuitry or components, such as boost converters, transformers, voltage multipliers, voltage regulators, and so on. These components can introduce complexity, cost, and potential limitations, so the decision to use a higher output voltage should be carefully considered based on the specific requirements and constraints of the system.

The present inventors believe that a solution to this problem involves the design of devices and circuits that can provide an output voltage higher than the supply voltage, but without the need for additional circuitry or components such as boost converters and so on.

BRIEF SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is, therefore, one aspect of the embodiments to provide for an apparatus and method that provides an output voltage is higher than a supply voltage.

It is another aspect of the embodiments to provide for an improved electronic circuit that can provide an output voltage higher than the supply voltage, but without the need for additional circuitry or components such as boost converters.

It is a further aspect of the embodiments to provide for an electrical circuit in which the output voltage is approximately double that of the supply voltage for the electrical circuit.

The aforementioned aspects and other objectives can now be achieved as described herein. In an embodiment, an electrical circuit can include a plurality of transistors including at least a first transistor and a second transistor, wherein the first transistor is electronically connected to an input and an output of the electrical circuit, and the second transistor is electronically connected to the first transistor and the output. The electrical circuit can further include a plurality of resistors comprising at least a first base resistor and a second base resistor, wherein the first base resistor is electronically connected to a voltage supply, the first transistor, the second base resistor and at least one diode. The electrical circuit can also include at least one capacitor electronically connected to the input, the first transistor, the second transistor, the at least one diode and the output, wherein an output voltage at the output is approximately double the supply voltage of the electrical circuit.

In an embodiment of the electrical circuit the first transistor can be switched on when the input is at a low voltage and the second transistor is off.

In an embodiment of the electrical circuit, the output can be pulled to a low voltage by the input through the first transistor.

In an embodiment of the electrical circuit, the at least one capacitor can be charged to the supply voltage via the at least one diode.

In an embodiment of the electrical circuit, the first transistor can be switched off when the input is approximately equal to the supply voltage and the voltage at an emitter of the second transistor is shifted to approximately two times the supply voltage by the at least one capacitor and wherein when the second transistor is switched on the output is pulled to approximately two times the voltage supply via the second transistor, the at least one capacitor and the input.

An embodiment of the electrical circuit can further include a tristate input.

In an embodiment of the electrical circuit, the first transistor and the second transistor can be arranged in a common base configuration.

In an embodiment of the electrical circuit, the common base configuration can enable fast switching.

In an embodiment of the electrical circuit, the common base configuration can enable a non-inverted output voltage from the electrical circuit with a current gain close to unity.

In an embodiment of the electrical circuit, the common base configuration can enable both fast switching and a non-inverted output voltage from the electrical circuit with a current gain close to unity.

In an embodiment, an electrical circuit can include: a plurality of transistors including at least a first transistor and a second transistor, wherein the first transistor is electronically connected to an input and an output, and the second transistor is electronically connected to the first transistor and the output; a plurality of resistors wherein at least one resistor among the plurality of resistors is electronically connected to a voltage supply, the first transistor, at least one diode and at least one other resistor among the plurality of resistors; and at least one capacitor electronically connected to the input, the first transistor, the second transistor, the at least one diode and the output, wherein an output voltage at the output is approximately double the supply voltage of the electrical circuit, wherein the first transistor is switched on when the input is at a low voltage and the second transistor is off and wherein the output is pulled to a low voltage by the input through the first transistor.

In an embodiment, a method of operating an electrical circuit, can involve switching on a first transistor among a plurality of transistors when the input is at a low voltage and a second transistor among the plurality of transistors is off, wherein the first transistor is electronically connected to the input and an output of the electrical circuit, and the second transistor is electronically connected to the first transistor and the output; and charging at least one capacitor to a supply voltage via at least one diode, wherein the at least one capacitor is electronically connected to the input, the first transistor, the second transistor, the at least one diode and the output, and wherein an output voltage at the output is approximately double the supply voltage of the electrical circuit.

An embodiment of the method can also involve providing a plurality of resistors comprising at least a first base resistor and a second base resistor, wherein the first base resistor is electronically connected to the voltage supply, the first transistor, the second base resistor and the at least one diode.

BRIEF DESCRIPTION OF THE DRAWINGS

The accompanying figures, in which like reference numerals refer to identical or functionally similar elements throughout the separate views and which are incorporated in and form a part of the specification, further illustrate the embodiments and, together with the detailed description, serve to explain the principles of the embodiments.

Identical or similar parts or elements in the figures may be indicated by the same reference numerals.

DETAILED DESCRIPTION

Figure 1:
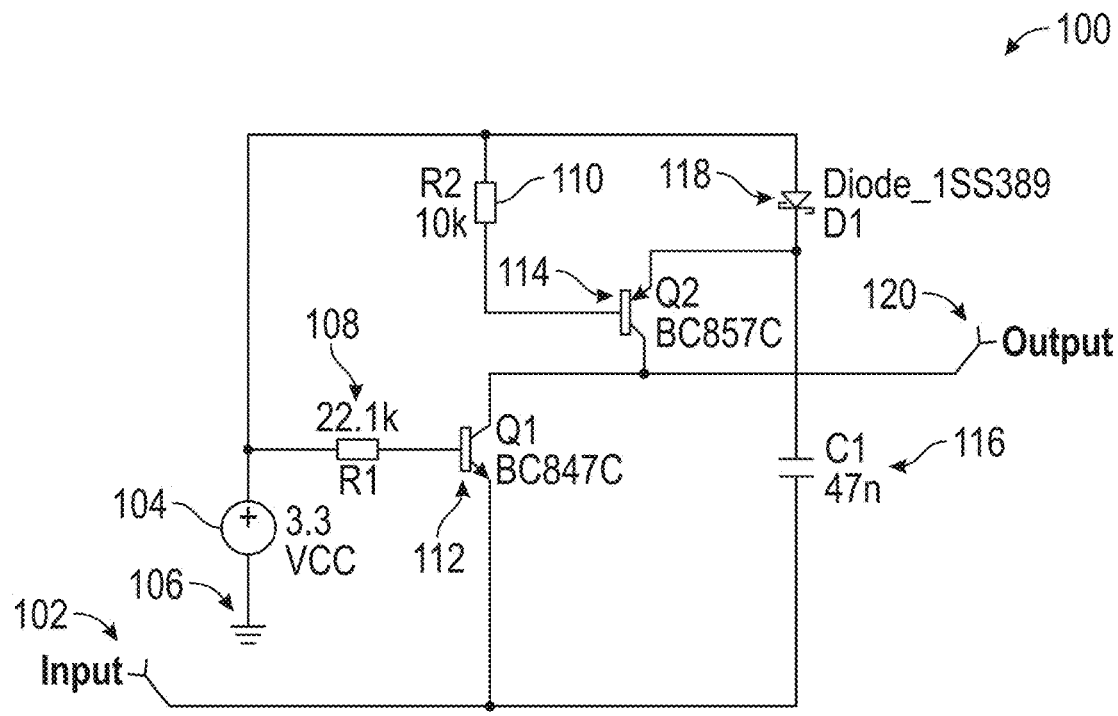
FIG. 1 illustrates a schematic diagram of a circuit that acts as a pulse voltage doubler and a level shifter, in accordance with an embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in an embodiment" or "in one embodiment" or "in an example embodiment" and variations thereof as utilized herein may or may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. Furthermore, the term "at least one" as used herein, may refer to "one or more." For example, "at least one widget" may refer to "one or more widgets."

In addition, the term "based on" may be understood as not necessarily intended to convey an exclusive set of factors and may, instead, allow for existence of additional factors not necessarily expressly described, again, depending at least in part on context.

FIG. 1 illustrates a schematic diagram of a circuit 100 that acts as a pulse voltage doubler and a level shifter, in accordance with an embodiment. The circuit 100 includes an input 102 and an output 120, along with a voltage supply 104 ("VCC") connected electronically to ground 106. The circuit 100 further includes a base resistor 108 ("R1") connected electronically to the voltage supply 104, an NPN transistor 112 ("Q1"), a base resistor 110 ("R2"), and a diode 100 ("D1"). The base resistor 110 can be further connected electronically to an PNP transistor 114 ("Q2"), which in turn can be connected electronically to the NPN transistor 112, a capacitor 116 ("C1"), and the output 120.

The specific values, numbers and parameters shown in the various circuit diagrams and graphs illustrated and discussed herein are presented for illustrative and exemplary purposes only and should not be considered limiting features of the embodiments. Other values, numbers and parameters can vary with different embodiments and implementations. For example, values such as 3.3 VCC, 22 1k and specific component names such as Q1 BC847C and so on are shown for illustrative and exemplary purposes only.

The circuit 100 can include one NPN transistor 112 and one NPN transistor 114 with the base resistors 108, 110, one capacitor 116 and one diode 118. The NPN transistor 112 ("Q1") can be switched on when the input voltage 104 is low and the PNP transistor 114 ("Q2") is off. The output 120 is also low. The output 120 is pulled to a low voltage by the input 102 through the NPN transistor 112 ("Q1"). The capacitor 115 ("C1") is charged to the voltage 104 ("VCC") via the diode 118 ("D1"). The NPN transistor 112 ("Q1") is switched off when the input 104 is high (=VCC). The voltage at the emitter of the PNP transistor 114 ("Q2") is shifted to approximately two times VCC by the capacitor 116 ("C1"), and the PNP transistor 114 ("Q2") is switched on. The output is pulled to approximately two times VCC via the PNP transistor 114 ("Q2"), the capacitor 116 ("C1") and the input 102.

The basic principle of circuit 100 (and the other circuits illustrated and discussed herein) is as follows. The two transistors 112 and 114 described above can be configured in a common base configuration, which can enable fast switching and a non-inverted output voltage with a current gain close to unity. The transistor Q1 (e.g., transistor 112 in FIG. 1) is switched on when the input 102 is low, so it pulls the output to low when the input 102 is low. It is switched off when the input is high. The emitter of the transistor Q2 (e.g., transistor 114 in FIG. 1) can be connected to the input via the capacitor 116.

The capacitor 116 can be charged via D1 (e.g., diode 118) when the input 102 is low. The voltage at the emitter of Q2 is the sum of voltage of the capacitor 116 and the input voltage. Therefore, Q2 can be switched on when the input 102 is high and off when the input 102 is low. Q1 can enable a steep falling edge while Q2 is off. Q2 can enable a steep rising edge while Q1 is off. These features facilitate fast switching, with an output 120 that is in phase with the input 102 and an output 102 at a high level, which is approximately the sum of the input 102 at a high level and the supply voltage 104.

Figure 2:
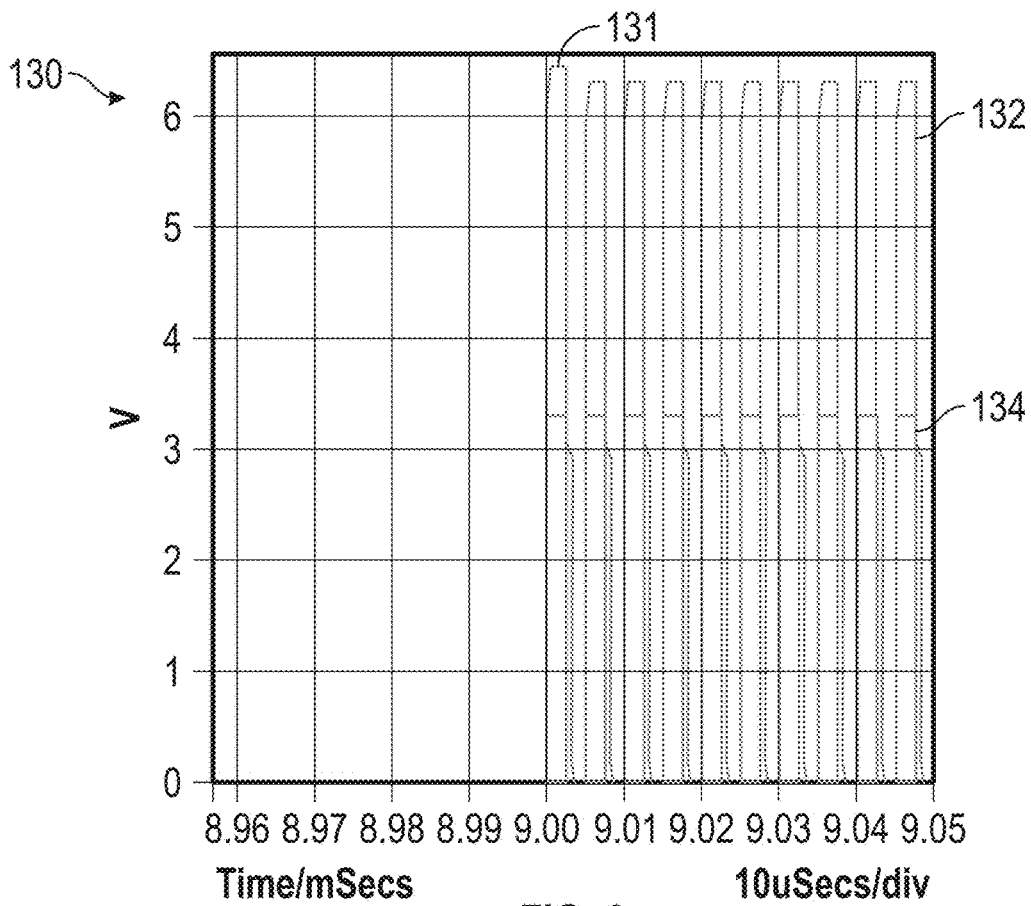
FIG. 2 illustrates a graph depicting voltage at the input and output of the circuit shown in FIG. 1, in accordance with an embodiment.

FIG. 2 illustrates a graph 130 depicting voltage at the input 102 and the output 120 of the circuit 100 shown in FIG. 1, in accordance with an embodiment. The voltage at the input 102 is indicated by the voltage pulses 134 shown in graph 130, while the voltage at the output is indicated by the voltage pulses 132 in graph 130.

Note that the first voltage pulse 131 shown in graph 130 is slightly higher than the others depicted in graph 130. During the long low period, the capacitor 115 ("C1") was charged to a slightly higher voltage. This causes a slightly higher voltage after a long low period. Bigger values of C1 can be used to attain a higher output voltage for more pulses or pulses with a longer duration. Note that the duty cycle must be <100% otherwise the high level of the output drops to approximately VCC. The diode 118 ("D1") may be replaced by a resistor for a duty cycle<50%.

Figure 3:
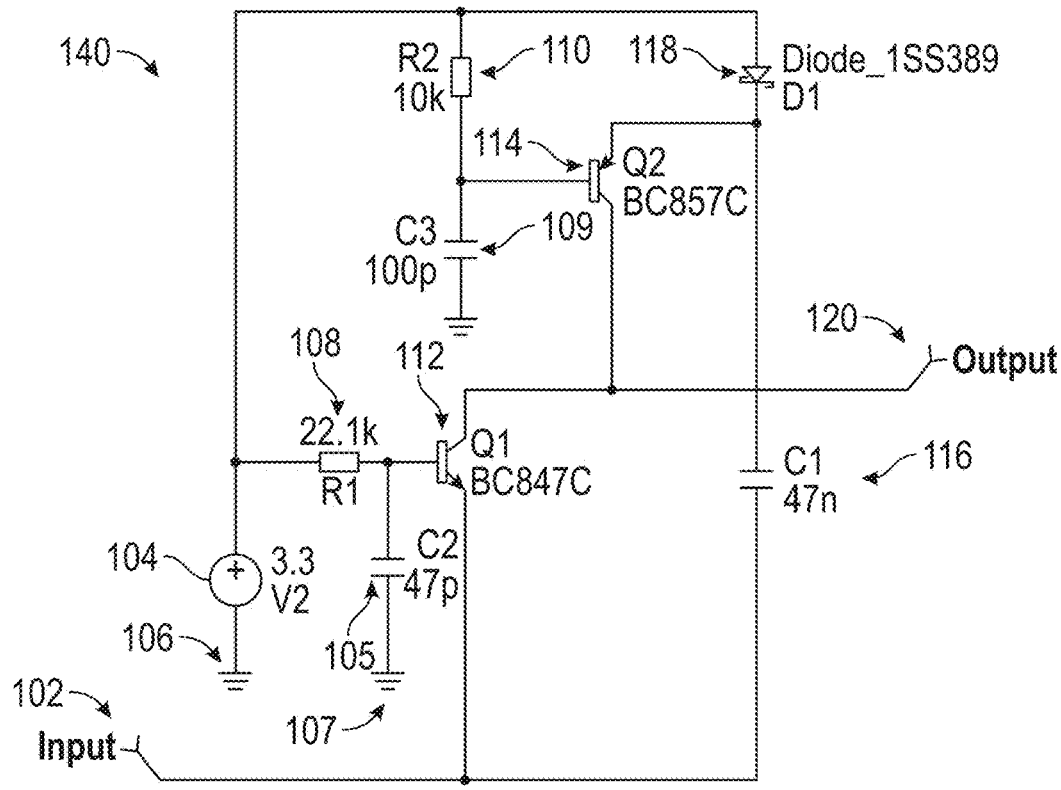
FIG. 3 illustrates a schematic diagram of an improved version of the circuit shown in FIG. 1, but with much faster switching than the configuration shown in FIG. 1, in accordance with an embodiment.

FIG. 3 illustrates a schematic diagram of a circuit 140 comprising an improved version of the circuit 100 shown in FIG. 1, but with much faster switching than the configuration of circuit 100, in accordance with an embodiment. Note that in FIG. 1 and FIG. 3, similar parts or elements are generally indicated by identical reference numerals. The circuit 140 thus includes input 102 and output 120. The input 120 can be electronically connected to the NPN transistor 112 ("Q1"), which in turn can be connected electronically to a capacitor 105 ("C2"), the output 120, and the PNP transistor 114 ("Q2"). The capacitor 105 ("C2") can be further connected electronically to ground 107 and the base resistor 108 ("R1").

The circuit 140 can further include the voltage supply 104 connected electronically to ground 106, the base resistor 108 ("R1"), the base resistor 110 ("R2") and the diode 119 ("D1"). The base resistor 110 ("R2") can be connected electronically to a capacitor 109 ("C3") and the PNP transistor 114. The capacitor 109 can be further connected electronically to ground 111. The PNP transistor 114 can be connected electronically to the output 120, the diode 118, and the NPN transistor 112 ("Q1").

The circuit 140 shown in FIG. 3 is similar to the circuit 100 shown in FIG. 1, but with the addition of electrical components. For example, the capacitor 105 ("C2") and the capacitor 109 ("C3") can be added to increase the switching speed of the NPN transistor 112 ("Q1") and the PNP transistor 114 ("Q2").

Figure 4:
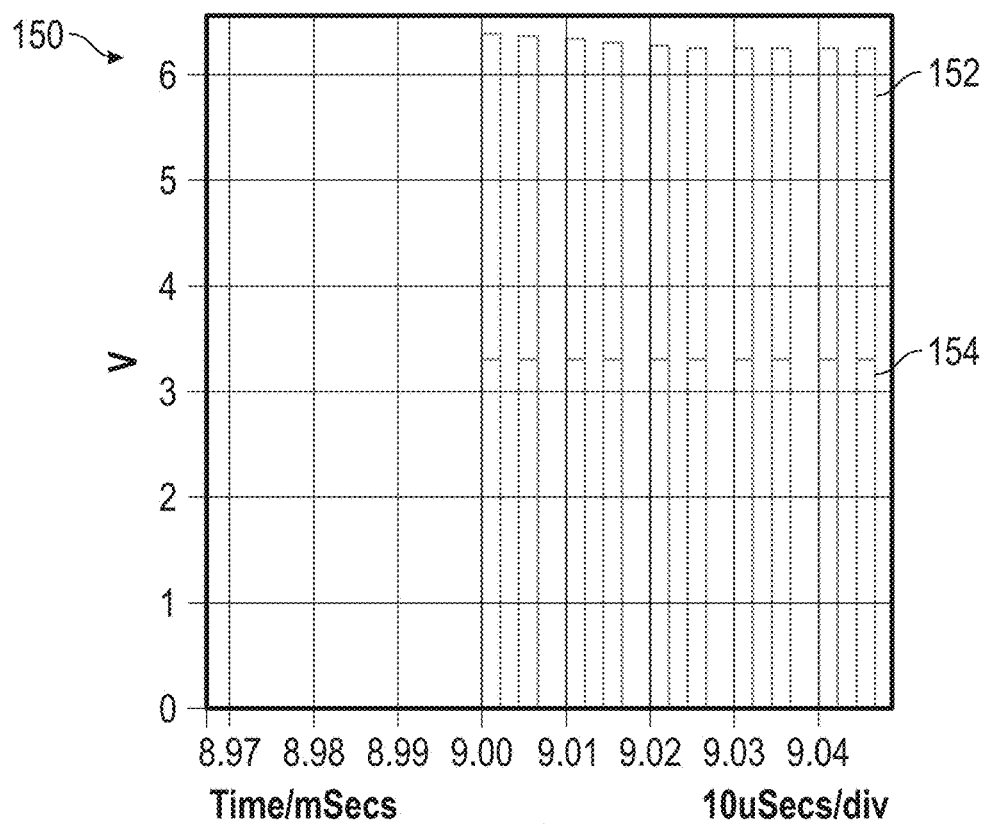
FIG. 4 illustrates a graph depicting voltage at the input and output of the circuit shown in FIG. 3, in accordance with an embodiment.

FIG. 4 illustrates a graph 152 depicting voltage at the input 102 and the output 120 of the circuit 140 shown in FIG. 3, in accordance with an embodiment. In graph 152, voltage pulses 154 indicate the voltage at the input 102, while the voltage pulses 152 indicate the voltage at the output 120.

Figure 5:
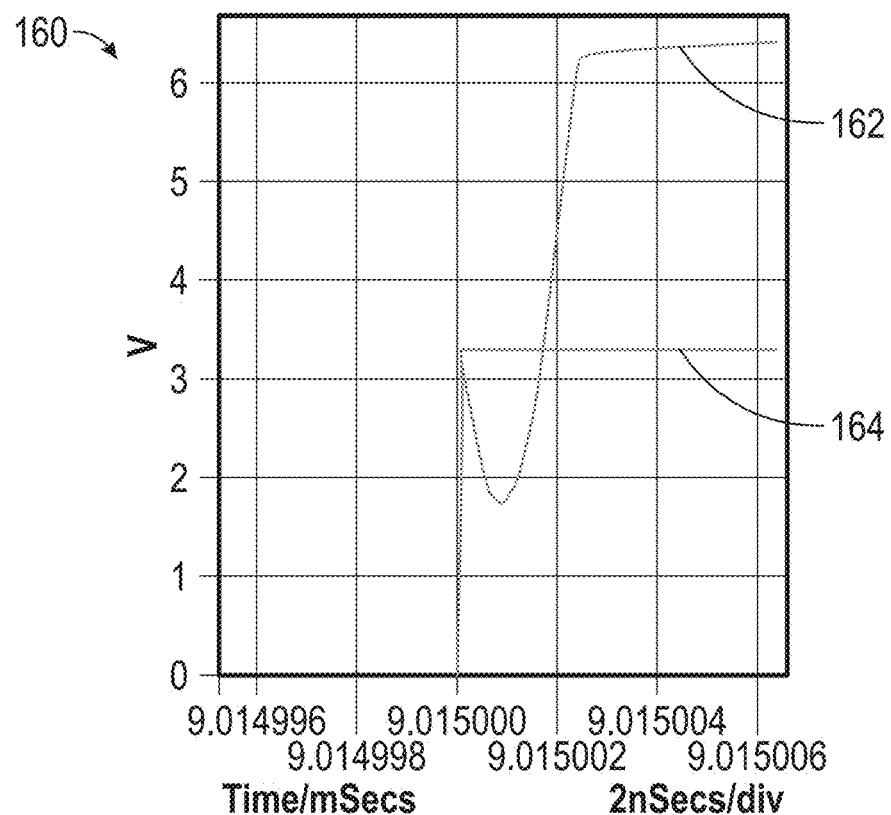
FIG. 5 illustrates a graph that depicts the rising edge of one pulse of the circuit shown in FIG. 3, in accordance with an embodiment.

FIG. 5 illustrates a graph 160 that depicts the rising edge of one pulse of the circuit 140 shown in FIG. 3, in accordance with an embodiment. That is, the pulse 164 shown in graph 160 relates to the voltage at the input 102 and the pulse 162 relates to the voltage at the output 120. In general, the output voltage needs less than 3 ns to reach approximately two times VCC including risetime and delay.

Figure 6:
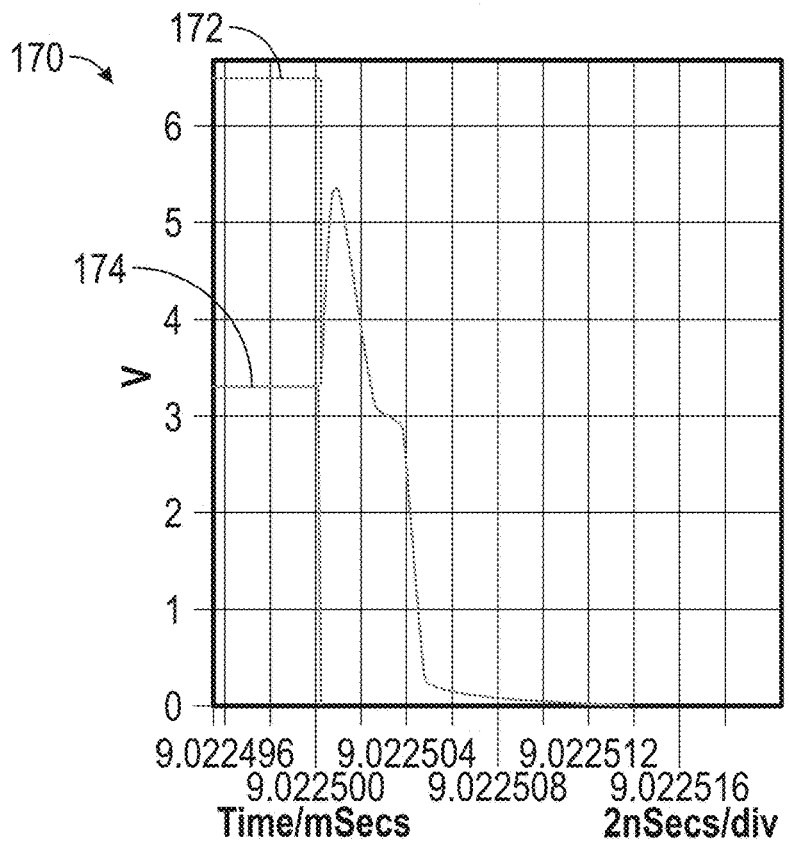
FIG. 6 illustrates a graph that depicts the falling edge of one pulse of the circuit shown in FIG. 3, in accordance with an embodiment.

FIG. 6 illustrates a graph 170 that depicts the falling edge of one pulse of the circuit 140 shown in FIG. 3, in accordance with an embodiment. That is, the pulse 172 shown in graph 170 relates to the voltage at the output 120 while the pulse 174 shown in graph 170 relates to the voltage at the input 102.

Figure 7:
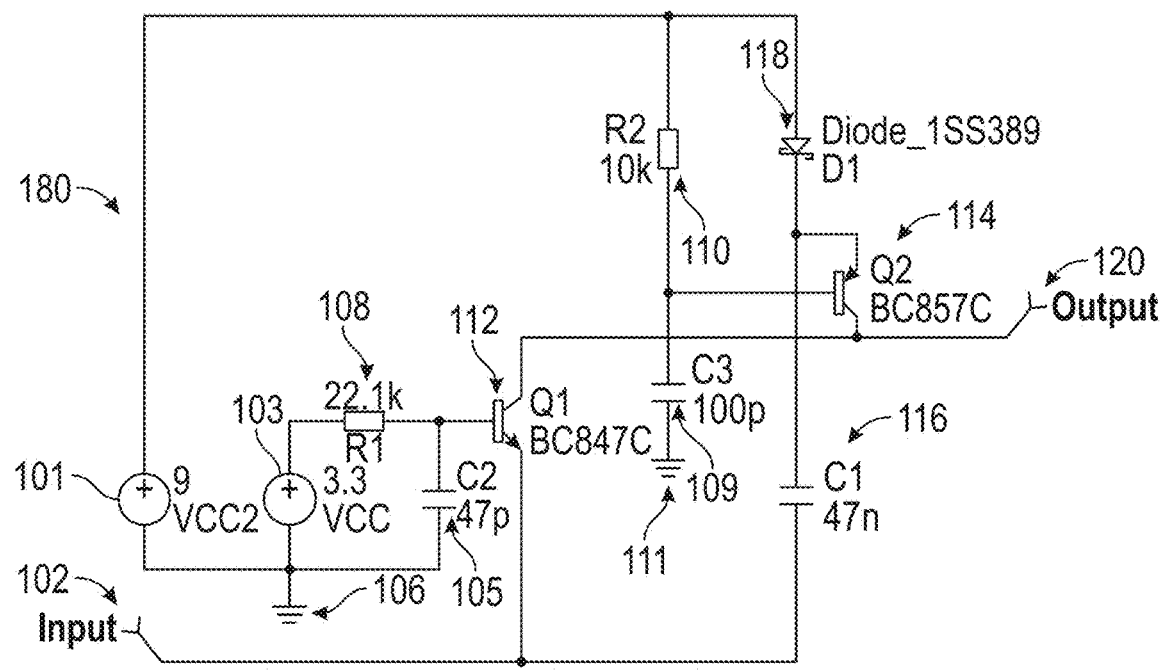
FIG. 7 illustrates a schematic diagram of a circuit with an additional higher supply voltage, in accordance with an embodiment.

FIG. 7 illustrates a schematic diagram of a circuit 180 with an additional higher supply voltage, in accordance with an embodiment. The circuit 180 shown in FIG. 7 includes a supply voltage 101 ("VCC2") and a supply voltage 103 ("VCC"). The supply voltage 101 ("VCC2") and the supply voltage 193 ("VCC") are connected electronically to ground 106. The capacitor 105 ("C2") is also connected electronically to ground 106. The base transistor 108 ("R1") can be connected electronically to the supply voltage 103, the capacitor 105, and the NPN transistor 112 ("Q1").

In circuit 180, the NPN transistor 112 ("Q1") can be connected electronically to the input 102, the capacitor 116 ("C1"), the capacitor 109 ("C3"), the base resistor 110 ("R2"), the output 120, and the PNP transistor 114 ("Q2"). The diode 118 ("D1") can be connected electronically to the PNP transistor 114 ("Q2") and the diode 118.

The circuit 180 depicted in FIG. 7 thus shows a different configuration of the previously discussed circuits 100 and 140 with an additional higher supply voltage. The level shifter can shift to much higher voltage in this configuration. In the configuration of circuit 180, the output high level is approximately VCC+VCC2.

Figure 8:
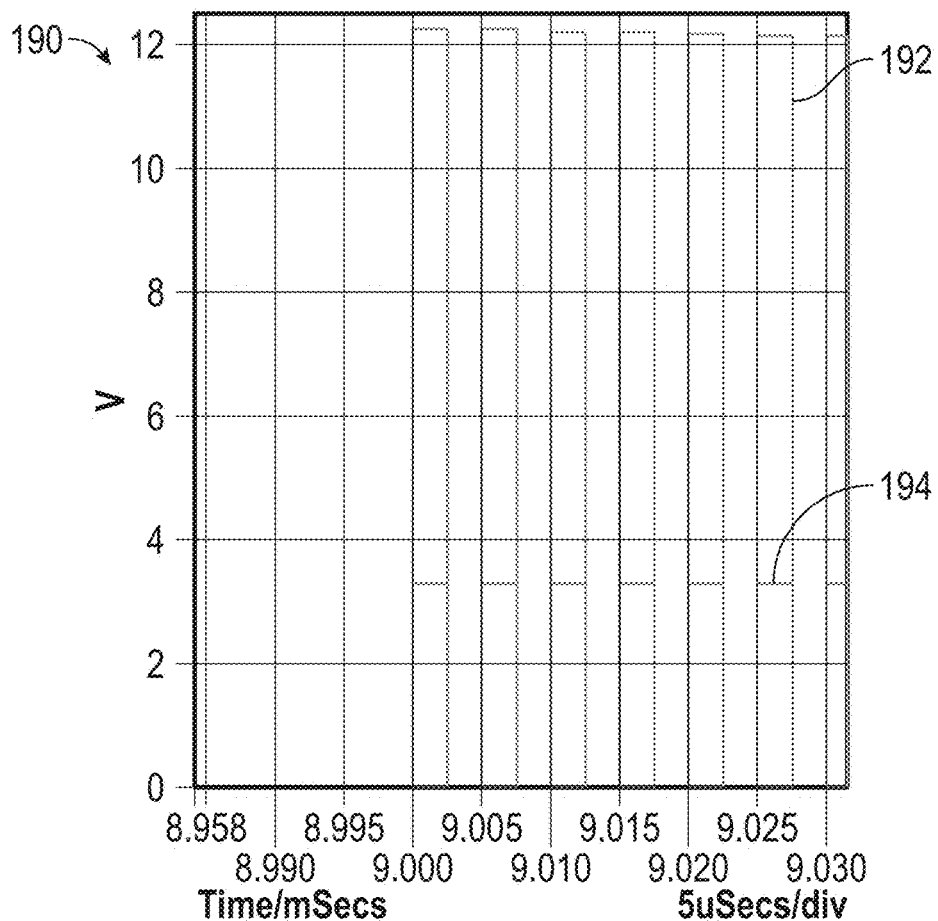
FIG. 8 illustrates a graph depicting voltage at the input and output of the circuit shown in FIG. 7, in accordance with an embodiment.

FIG. 8 illustrates a graph 190 depicting voltage at the input 102 and the output 120 of the circuit 180 shown in FIG. 7, in accordance with an embodiment. In graph 190, the pulses 192 indicate voltage at the output 120 and the pulses 194 indicate voltage at the input 102. The circuits described herein (e.g., circuit 100, circuit 140, circuit 180) can enable delays between the output 120 and the input 103 in the range of ns (nano seconds). The supply current is in the range of μA (micro amps). Nevertheless, these circuits require only a few low cost components to achieve a level shifter that is fast but which a supply current that is low.

Figure 9:
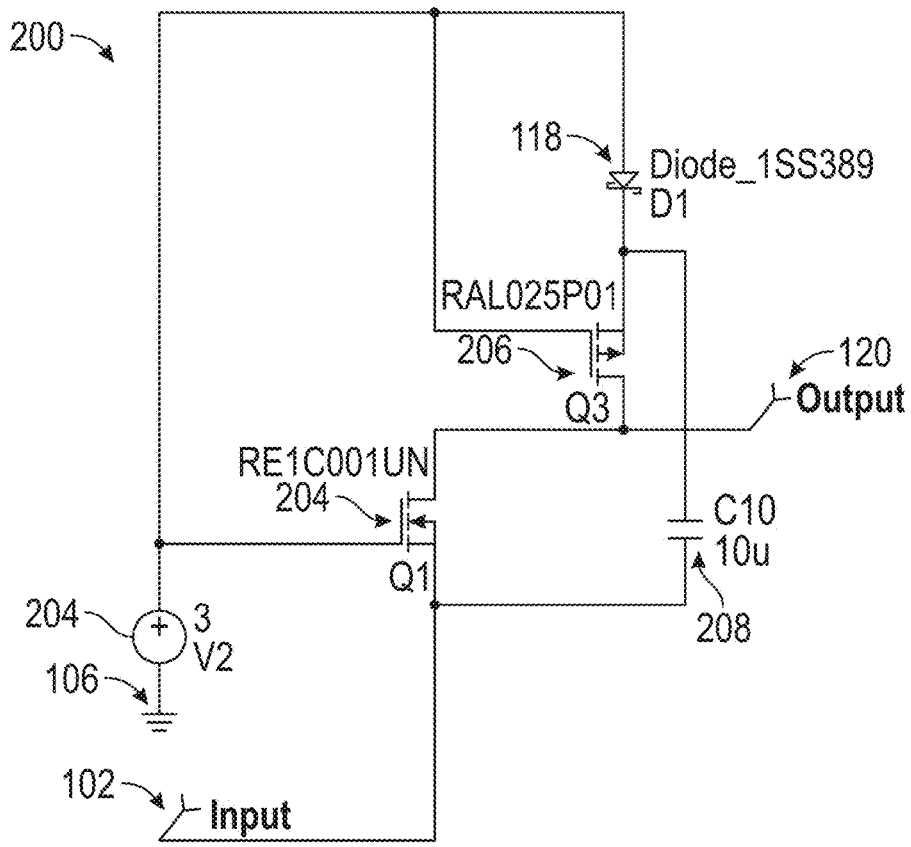
FIG. 9 illustrates a schematic diagram of a level shifter circuit, which can be implemented in accordance with an embodiment.

FIG. 9 illustrates a schematic diagram of a level shifter circuit 200, which can be implemented in accordance with an embodiment. The level shifter circuit 200 shown in FIG. 9 can function as a pulse voltage doubler and level shifter similar to the circuits described herein, albeit with some different components and features. As noted previously, like elements or parts discussed herein with respect to the various figures indicated similar or identical elements.

The level shifter circuit 200 shown in FIG. 9 can include first and second transistors similar to the other transistors discussed previously, except in this case field-effect transistors (FETs) are used. That is, the level shifter circuit 200 can include MOSFET transistor 204 (Q12) and MOSFET transistor 206 (Q2). A voltage source 204 can be connected electronically to ground 106 and to the MOSFET transistor 204 and the MOSFET transistor 206. The diode 18 can connect electronically to the MOSFET transistor 206 and the MOSFET transistor 204. Both the MOSFET transistor 204 and the MOSFET transistor 206 can connect electronically to the capacitor 208 and to the output 120.

The MOSFET transistor 204 and the MOSFET transistor 206 of the level shifter circuit 200 can be configured in a common gate configuration, which as discussed previously can enable fast switching and a non-inverted output voltage with a current gain close to unity. The output 120 can be in phase with the input 102 with the output 102 at a high level, which is approximately the sum of the input 102 at a high level and the supply voltage 104, as discussed previously.

In the example level shifter 200 shown in FIG. 9, MOSFETs can be used instead of bipolar transistors. This configuration requires fewer components than the previously discussed bipolar versions but may be slower than the bipolar version in an optimum configuration due to the gate capacitances of the MOSFETs although this embodiment may actually be faster in a minimum configuration.

Figure 10:
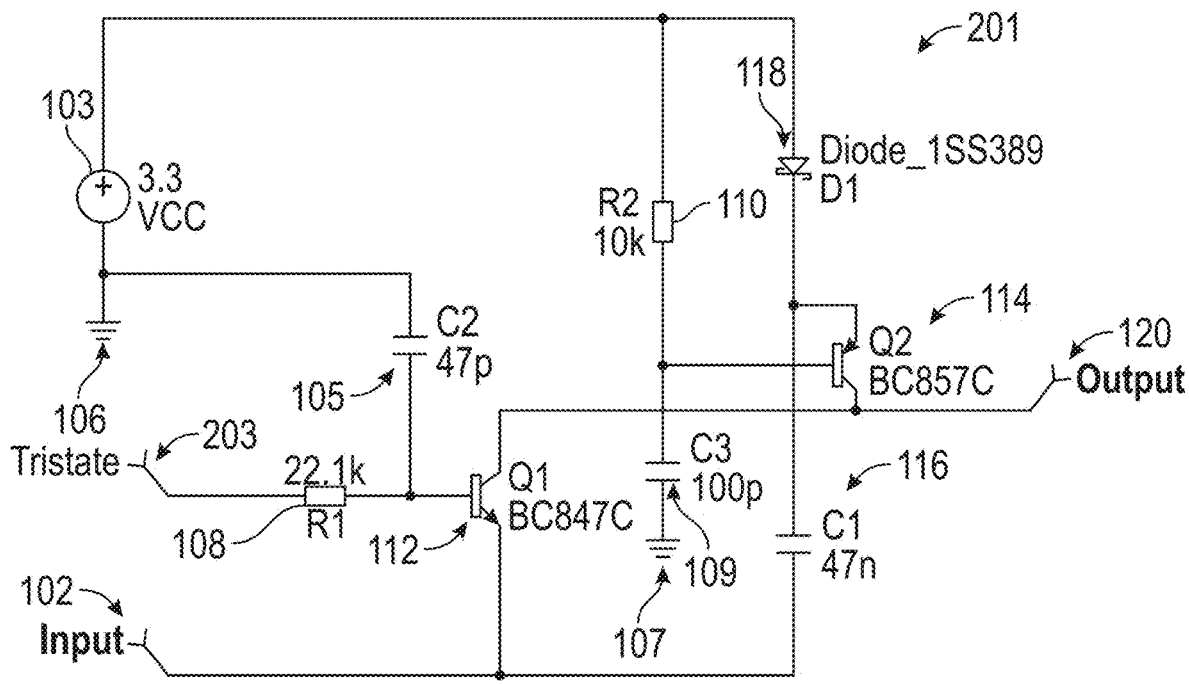
FIG. 10 illustrates a schematic diagram of a tristate implementation of a level shifter circuit in accordance with an embodiment.

FIG. 10 illustrates a schematic diagram of a tristate implementation of a level shifter circuit 201 in accordance with an embodiment. The level shifter circuit 201 shown in FIG. 10 is similar to the previously discussed circuits but with some differences. The level shifter circuit 201, which can function as both a pulse voltage doubler and a level shifter similar to the circuits described herein can include the input 102 and a tristate input 203.

The level shifter circuit 201 is a variant to the previously discussed circuits with the additional tristate input 203. With this input 203, the output 102 can be switched into a high resistance mode ((TRISTATE=HIGH=>output active; TRISTATE=LOW and input=LOW=>output=high resistance mode with minimum current consumption).

Note that as utilized herein the term 'tristate' in the context of an electrical circuit and in particular an integrated circuit relates to a tristate input, which refers to an input pin or signal that can assume one of three states: high (logic 1), low (logic 0), or high impedance (also known as "floating" or "disconnected").

When a tristate output is in a high impedance state, it effectively disconnects itself from the circuit, allowing other devices or signals to drive the line without interference. This feature is particularly useful in situations where multiple devices share a common bus or communication line. By placing their outputs in the high impedance state when not actively driving the line, devices can avoid creating conflicts or short circuits on the shared bus.

In the configuration of the electrical circuit 201, the tristate input 203 connects electrically to the first resistor 108, which in turn connects electrically to Q1 (transistor 112), which connects to the input 102. The capacitor 105 can connect electronically to the resistor 108 and Q1, and also to ground 106 and voltage source 103. The level shifter circuit 201 also can include capacitor 109 connected electronically to ground 109 and the capacitor 116. Q1 and the capacitors 109 and 116 can further connect electronically to output 120, Q2 (transistor 114), resistor 110, and output 120. The diode 118 (D1) can connect electronically to Q2 and the output 120.

Figure 11:
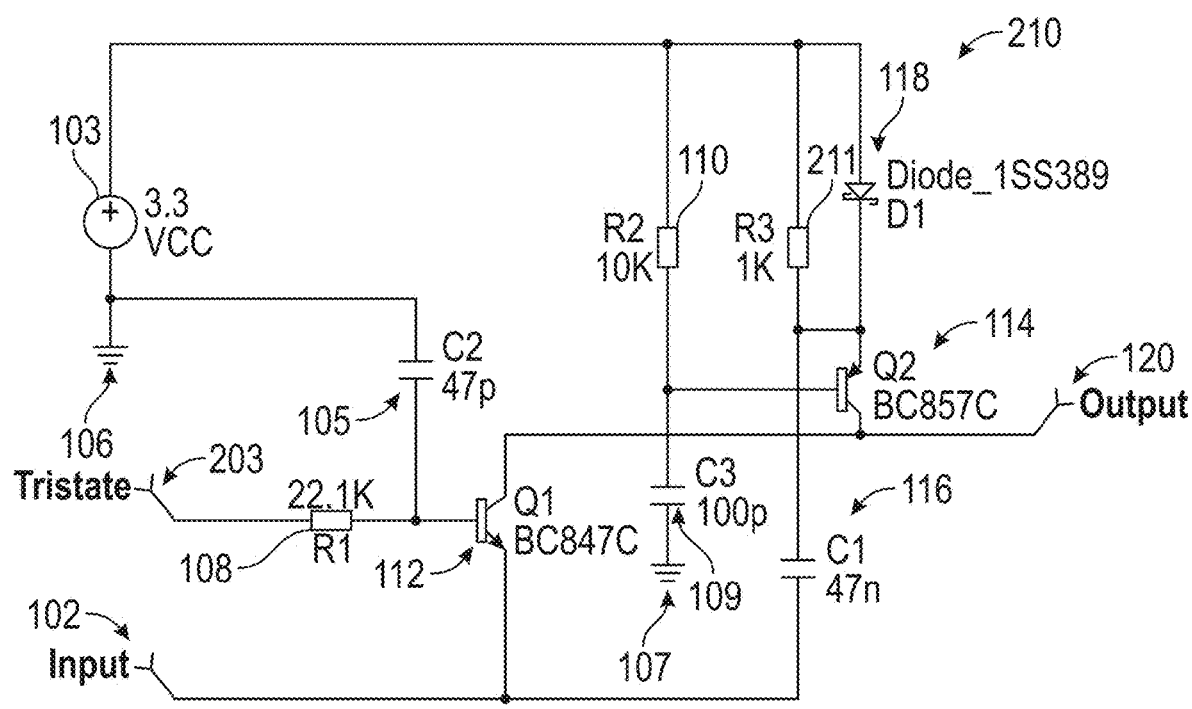
FIG. 11 illustrates a schematic diagram of a tristate implementation of a level shifter circuit in accordance with an embodiment.

FIG. 11 illustrates a schematic diagram of a tristate implementation of a level shifter circuit 210 in accordance with an embodiment. The configuration shown in FIG. 11 can include a tristate input 203 and the input 102 along with a third resistor 211. The level shifter circuit 210 can function as a pulse voltage doubler and a level shifter similar to the circuits described previously. In the example level shifter circuit 210 shown in FIG. 11, the third resistor 211 is in parallel with D1. This configuration can enable a slightly higher output voltage in some applications.

Figure 12:
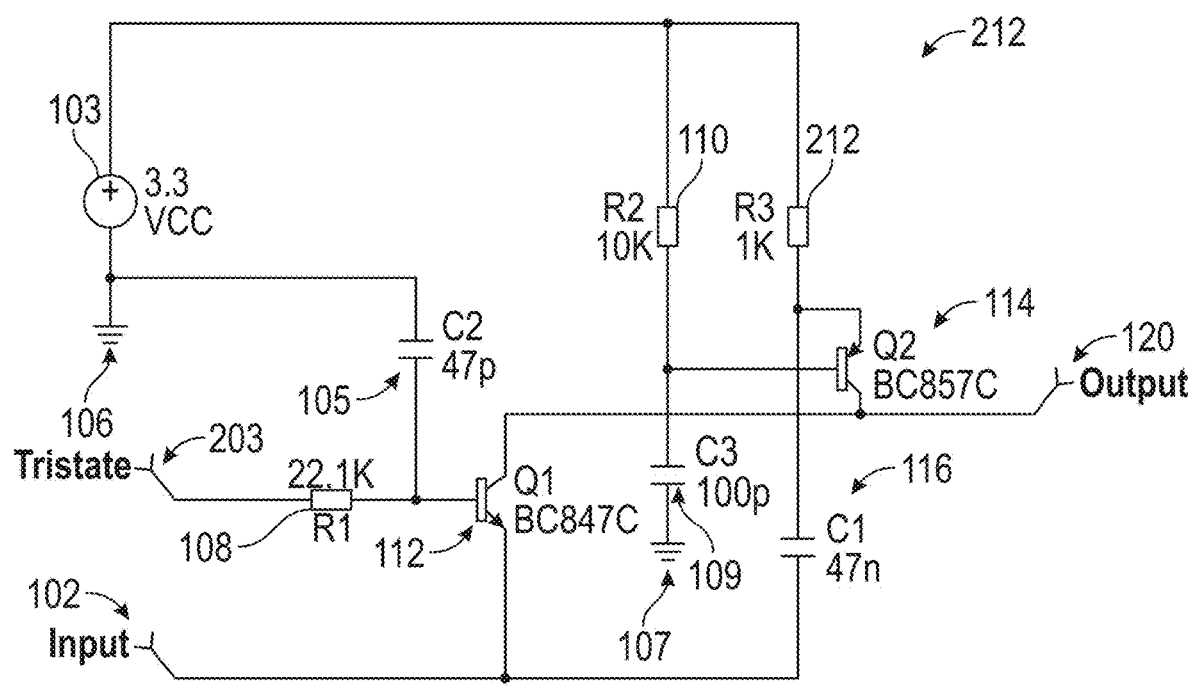
FIG. 12 illustrates a schematic diagram of a tristate implementation of a level shifter circuit in accordance with an embodiment.

FIG. 12 illustrates a schematic diagram of a tristate implementation of a level shifter circuit 212 in accordance with an embodiment. The level shifter circuit 212 is similar to the other circuits described herein including the use of the tristate input, but with the third resistor 212 connected electronically to Q2, the resistor 110 and the voltage supply 103. Like the other circuits described herein, the level shifter circuit 212 can function as a pulse voltage doubler and a level shifter similar. In the example embodiment shown in FIG. 12, the third resistor 212 can be used in place of D1 in the other circuits. The circuit 212 shown in FIG. 12 may be suitable for low duty cycle applications.

Based on the foregoing, it can be appreciated that a number of embodiments including preferred and alternative embodiments are disclosed herein. For example, in an embodiment, an electrical circuit can include a plurality of transistors including at least a first transistor and a second transistor, wherein the first transistor is electronically connected to an input and an output of the electrical circuit, and the second transistor is electronically connected to the first transistor and the output. The electrical circuit can further include a plurality of resistors comprising at least a first base resistor and a second base resistor, wherein the first base resistor is electronically connected to a voltage supply, the first transistor, the second base resistor and at least one diode. The electrical circuit can also include at least one capacitor electronically connected to the input, the first transistor, the second transistor, the at least one diode and the output, wherein an output voltage at the output is approximately double the supply voltage of the electrical circuit.

In an embodiment of the electrical circuit the first transistor can be switched on when the input is at a low voltage and the second transistor is off.

In an embodiment of the electrical circuit, the output can be pulled to a low voltage by the input through the first transistor.

In an embodiment of the electrical circuit, the at least one capacitor can be charged to the supply voltage via the at least one diode.

In an embodiment of the electrical circuit, the first transistor can be switched off when the input is approximately equal to the supply voltage and the voltage at an emitter of the second transistor is shifted to approximately two times the supply voltage by the at least one capacitor and wherein when the second transistor is switched on the output is pulled to approximately two times the voltage supply via the second transistor, the at least one capacitor and the input.

An embodiment of the electrical circuit can further include a tristate input.

In an embodiment of the electrical circuit, the first transistor and the second transistor can be arranged in a common base configuration.

In an embodiment of the electrical circuit, the common base configuration can enable fast switching.

In an embodiment of the electrical circuit, the common base configuration can enable a non-inverted output voltage from the electrical circuit with a current gain close to unity.

In an embodiment of the electrical circuit, the common base configuration can enable both fast switching and a non-inverted output voltage from the electrical circuit with a current gain close to unity.

In an embodiment, an electrical circuit can include: a plurality of transistors including at least a first transistor and a second transistor, wherein the first transistor is electronically connected to an input and an output, and the second transistor is electronically connected to the first transistor and the output; a plurality of resistors wherein at least one resistor among the plurality of resistors is electronically connected to a voltage supply, the first transistor, at least one diode and at least one other resistor among the plurality of resistors; and at least one capacitor electronically connected to the input, the first transistor, the second transistor, the at least one diode and the output, wherein an output voltage at the output is approximately double the supply voltage of the electrical circuit, wherein the first transistor is switched on when the input is at a low voltage and the second transistor is off and wherein the output is pulled to a low voltage by the input through the first transistor.

In yet another embodiment, a method of operating an electrical circuit, can involve switching on a first transistor among a plurality of transistors when the input is at a low voltage and a second transistor among the plurality of transistors is off, wherein the first transistor is electronically connected to the input and an output of the electrical circuit, and the second transistor is electronically connected to the first transistor and the output; and charging at least one capacitor to a supply voltage via at least one diode, wherein the at least one capacitor is electronically connected to the input, the first transistor, the second transistor, the at least one diode and the output, and wherein an output voltage at the output is approximately double the supply voltage of the electrical circuit.

An embodiment of the method can also involve providing a plurality of resistors comprising at least a first base resistor and a second base resistor, wherein the first base resistor is electronically connected to the voltage supply, the first transistor, the second base resistor and the at least one diode.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. An electrical circuit, comprising:
a plurality of transistors including at least a first transistor and a second transistor, wherein the first transistor is electronically connected to an input and an output of the electrical circuit, and the second transistor is electronically connected to the first transistor and the output;
a plurality of resistors comprising at least a first base resistor and a second base resistor, wherein the first base resistor is electronically connected to a tristate input and the first transistor, wherein the second base resistor and at least one diode are electronically connected to at least one voltage supply, wherein a high level voltage of the tristate input is approximately the same as a high level voltage of the input; and
at least one capacitor electronically connected to the first transistor, the second transistor, the at least one diode and the input, wherein a high level of the output voltage at the output is approximately a sum of the supply voltage of the electrical circuit and the high level voltage of the input.

2. The electrical circuit of claim 1 wherein the first transistor is switched on at a condition when the input is at a low voltage and the tristate input is at a high voltage and second transistor is off at the condition.

3. The electrical circuit of claim 1 wherein the output is pulled to a low voltage by the input through the first transistor.

4. The electrical circuit of claim 1 wherein the at least one capacitor is charged to the supply voltage via the at least one diode.

5. The electrical circuit of claim 1 wherein the first transistor is switched off when the input is approximately equal to the tristate input voltage and the voltage at an emitter of the second transistor is shifted to approximately the sum of the input voltage and the supply voltage by the at least one capacitor and wherein when the second transistor is switched on the output is pulled to approximately the sum of the input voltage and the voltage supply via the second transistor, the at least one capacitor and the input.

6. The electrical circuit of claim 1 wherein the tristate input is connected to the supply voltage and the input high level voltage is approximately equal to the supply voltage, causing an output high level voltage that is approximately a double of the supply voltage.

7. The electrical circuit of claim 1 wherein the first transistor and the second transistor are arranged in a common base configuration.

8. The electrical circuit of claim 7 wherein the common base configuration enables fast switching.

9. The electrical circuit of claim 7 wherein the common base configuration enables a non-inverted output voltage from the electrical circuit with a current gain close to unity.

10. The electrical circuit of claim 7 wherein the common base configuration enables fast switching and a non-inverted output voltage from the electrical circuit with a current gain close to unity.

11. An electrical circuit, comprising:
a plurality of transistors including at least a first transistor and a second transistor, wherein the first transistor is electronically connected to an input and an output, and the second transistor is electronically connected to the first transistor and the output;
a plurality of resistors wherein at least one resistor among the plurality of resistors is electronically connected to a voltage supply, the first transistor, at least one diode and at least one other resistor among the plurality of resistors;
at least one capacitor electronically connected to the input, the first transistor, the second transistor, the at least one diode and the output, wherein an output voltage at the output is approximately double the supply voltage of the electrical circuit, wherein the first transistor is switched on when the input is at a low voltage and the second transistor is off and wherein the output is pulled to a low voltage by the input through the first transistor.

12. The electrical circuit of claim 11 wherein the at least one capacitor is charged to the supply voltage via the at least one diode.

13. The electrical circuit of claim 11 wherein the first transistor is switched off when the input is approximately equal to the supply voltage and the voltage at an emitter of the second transistor is shifted to approximately two times the supply voltage by the at least one capacitor and wherein when the second transistor is switched on the output is pulled to approximately two times the voltage supply via the second transistor, the at least one capacitor and the input.

14. The electrical circuit of claim 11 further comprising a tristate input.

15. The electrical circuit of claim 11 wherein the first transistor and the second transistor are arranged in a common base configuration.

16. The electrical circuit of claim 15 wherein the common base configuration enables fast switching.

17. The electrical circuit of claim 15 wherein the common base configuration enables a non-inverted output voltage from the electrical circuit with a current gain close to unity.

18. The electrical circuit of claim 15 wherein the common base configuration enables fast switching and a non-inverted output voltage from the electrical circuit with a current gain close to unity.

19. A method of operating an electrical circuit, comprising:
switching on a first transistor among a plurality of transistors when the input is at a low voltage and a second transistor among the plurality of transistors is off, wherein the first transistor is electronically connected to the input and an output of the electrical circuit, and the second transistor is electronically connected to the first transistor and the output;
charging at least one capacitor to a supply voltage via at least one diode, wherein the at least one capacitor is electronically connected to the input, the first transistor, the second transistor, the at least one diode and the output, and wherein an output voltage at the output is approximately double the supply voltage of the electrical circuit.

20. The method of claim 19 further comprising:
providing a plurality of resistors comprising at least a first base resistor and a second base resistor, wherein the first base resistor is electronically connected to the voltage supply, the first transistor, the second base resistor and the at least one diode.

* * * * *